(12) United States Patent
Cho et al.

(10) Patent No.: US 10,347,484 B2
(45) Date of Patent: Jul. 9, 2019

(54) LASER CRYSTALLIZING APPARATUS

(71) Applicant: SAMSUNG DISPLAY CO., LTD., Yongin-si, Gyeonggi-Do (KR)

(72) Inventors: Joo Woan Cho, Seongnam-si (KR); Jeong Kyun Na, Suwon-si (KR); Seung Hwan Lee, Seoul (KR); Joon-Hwa Bae, Suwon-si (KR); Byoung Ho Cheong, Yongin-si (KR); Byoung Kwon Choo, Hwaseong-si (KR); Oleg Prudnikov, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 557 days.

(21) Appl. No.: 15/084,201

(22) Filed: Mar. 29, 2016

(65) Prior Publication Data

US 2017/0062248 A1     Mar. 2, 2017

(30) Foreign Application Priority Data

Aug. 25, 2015 (KR) .................. 10-2015-0119665

(51) Int. Cl.
 *H01L 21/67* (2006.01)
 *H01L 21/02* (2006.01)
 *G02B 27/28* (2006.01)

(52) U.S. Cl.
 CPC ...... *H01L 21/02678* (2013.01); *G02B 27/283* (2013.01); *G02B 27/286* (2013.01)

(58) Field of Classification Search
 CPC ......... H01L 21/67115; H01L 21/02678; G02B 5/3083; G02B 27/283; G02B 27/286
 See application file for complete search history.

(56) References Cited

U.S. PATENT DOCUMENTS 6,650,480 B2   11/2003   Tanaka
6,653,179 B1   11/2003   Minegishi et al.
(Continued)

FOREIGN PATENT DOCUMENTS

EP          0 459 503 A2    12/1991
KR    10-1992-0001788        1/1992
(Continued)

OTHER PUBLICATIONS

Growth of spontaneous periodic surface structures on solids during laser illumination, Zhou et al., 1982, Phys. Rev. B, vol. 26, No. 10, 5366-5381.

*Primary Examiner* — David E Smith
*Assistant Examiner* — Hsien C Tsai
(74) *Attorney, Agent, or Firm* — F. Chau & Associates, LLC

(57) ABSTRACT

A laser crystallizing apparatus includes a laser generator that generates an incident laser beam that includes a P polarization component and an S polarization component, an optical system that converts the incident laser beam to generate an emitted laser beam, and a stage on which is mounted a target substrate with a target thin film which is laser-crystallized by being irradiated by the emitted laser beam. The optical system includes at least one half wave plate (HWP) that shifts a polarization axis direction of the incident laser beam received from the laser generator, at least one mirror that fully reflects the laser beam, and at least one polarization beam splitter (PBS) which reflects a part of the laser beam and transmits the other part of the laser beam.

20 Claims, 5 Drawing Sheets

(56) References Cited

U.S. PATENT DOCUMENTS

| | | | |
|---|---|---|---|
| 2004/0074881 A1* | 4/2004 | Oishi | B23K 26/0736 |
| | | | 219/121.63 |
| 2008/0247150 A1* | 10/2008 | Itoh | G02B 6/0028 |
| | | | 362/19 |
| 2013/0293945 A1* | 11/2013 | Ishihara | G02F 1/3534 |
| | | | 359/326 |

FOREIGN PATENT DOCUMENTS

| KR | 1019990033429 | 5/1999 |
|---|---|---|
| KR | 1020110034338 | 4/2011 |

\* cited by examiner

LASER CRYSTALLIZING APPARATUS

CROSS REFERENCE TO RELATED APPLICATIONS

This application claims priority under 35 U.S.C. § 119 from, and the benefit of, Korean Patent Application No. 10-2015-0119665, filed in the Korean Intellectual Property Office on Aug. 25, 2015, the contents of which are herein incorporated by reference in their entirety.

BACKGROUND

1. Technical Field

Embodiments of the present disclosure are directed to a laser crystallizing apparatus, and more particularly, to a laser crystallizing apparatus that crystallizes an amorphous silicon thin film into a polycrystalline silicon thin film by using an excimer laser.

2. Discussion of the Related Art

Methods of preparing a polycrystalline silicon thin film transistor at a low temperature include a solid phase crystallization (SPC) method, a metal induced crystallization (MIC) method, a metal induced lateral crystallization (MILC) method, an excimer laser annealing (ELA) method, etc. In particular, in a process of manufacturing an organic light emitting device (OLED) or a liquid crystal display (LCD), the ELA method of crystallization using a high energy laser beam is used.

An ELA method includes irradiating a laser beam to amorphous silicon to phase-change the amorphous silicon into polycrystalline silicon, and using a cumulative shot process of 20 times or more to crystallize a part of the silicon. When using a 308 nm wavelength UV excimer laser, the UV light is fully absorbed in a wavelength range of about 300 nm to about 400 nm, but because UV light also has a reflectance of about 40% or more, the reflected UV light is not used for crystallization and lost. Because the reflectance of polycrystalline silicon is about 50% or more, in spite of the cumulative shots, the loss thereof is large.

A laser beam incident to a beam splitting polarization module, which is currently used with mass-produced equipment, has a random polarization, and the polarization module has a plurality of lenses and mirrors. The laser beam is converted from a quadrangular beam into a linear beam in the polarization module. When a randomly polarized laser beam is used for grain alignment, a multiple beam of 15 shots or more is required.

SUMMARY

Embodiments of the present disclosure can provide a laser crystallizing apparatus that includes an optical system which converts a randomly polarized laser beam into a linearly polarized laser beam to enhance grain alignment.

An exemplary embodiment provides a laser crystallizing apparatus that includes a laser generator that generates an incident laser beam that includes a P polarization component and an S polarization component; an optical system that converts the incident laser beam to generate an emitted laser beam; and a stage on which is mounted a target substrate with a target thin film, which is laser-crystallized by being irradiated by the emitted laser beam. The optical system includes at least one half wave plate (HWP) that shifts a polarization axis direction of the incident laser beam received from the laser generator, at least one mirror that fully reflects the laser beam, and at least one polarization beam splitter (PBS) which partially reflects and partially transmits the laser beam.

According to a further embodiment, the laser generator includes a first laser generator that generates a first incident laser beam, and the optical system includes a first half wave plate that shifts a polarization axis direction of the first incident laser beam received from the first laser generator to generate a second laser beam, a first mirror that reflects the second laser beam received from the first half wave plate, a first polarization beam splitter that reflects a part of the second laser beam received from the first mirror as a third laser beam and transmits the other part of the second laser beam as a fourth laser beam, a second mirror that reflects the fourth laser beam received from the first polarization beam splitter, a second half wave plate that shifts a polarization axis direction of the third laser beam reflected by the first polarization beam splitter to generate a fifth laser beam, and a third half wave plate that shifts the polarization axis direction of the fourth laser beam reflected from the second mirror to generate a sixth laser beam.

According to a further embodiment, the incident laser beam is randomly polarized.

According to a further embodiment, the second laser beam received from the first half wave plate is linearly polarized.

According to a further embodiment, the polarization beam splitter transmits the P polarization component and reflects the S polarization component.

According to a further embodiment, the polarization beam splitter is inclined at an angle of from about 45° to about 60°.

According to a further embodiment, the half wave plate converts between the S polarization component and the P polarization component when inclined at an angle of about 90°.

According to a further embodiment, the laser generator furthers include a second laser generator that generates a second incident laser beam, and the optical system further includes a fourth half wave plate that shifts a polarization axis direction of the second incident laser beam received from the second laser generator to generate a seventh laser beam; a third mirror that reflects the seventh laser beam received from the fourth half wave plate; a second polarization beam splitter that reflects a part of the seventh laser beam reflected by the first mirror as an eighth laser beam and transmits the other part of the seventh laser beam as an ninth laser beam; a fourth mirror that reflects the ninth laser beam received from the second polarization beam splitter; a fifth half wave plate that shifts a polarization axis direction of the eighth laser beam reflected by the second polarization beam splitter to generate a tenth laser beam; and a sixth half wave plate that shifts the polarization axis direction of the ninth laser beam reflected by the fourth mirror to generate an eleventh laser beam.

According to a further embodiment, the second laser beam received from the fourth half wave plate is linearly polarized.

An exemplary embodiment provides a laser crystallizing apparatus that includes a first laser generator that generates a first incident laser beam, a first half wave plate that shifts a polarization axis direction of the first incident laser beam received from the first laser generator to generate a second laser beam, a first mirror that reflects the second laser beam received from the first half wave plate, a first polarization beam splitter that reflects a part of the second laser beam received from the first mirror as a third laser beam and transmits the other part of the second laser beam as a fourth laser beam, a second mirror that reflects the fourth laser beam received from the first polarization beam splitter, a second half wave plate that shifts a polarization axis direction of the third laser beam received from the first polarization beam splitter to generate a fifth laser beam, and a third half wave plate that shifts the polarization axis direction of the fourth laser beam received from the second mirror to generate a sixth laser beam, where the fifth laser beam and the sixth laser beam are combined to generate an emitted laser beam.

According to a further embodiment, the first incident laser beam is randomly polarized.

According to a further embodiment, the second laser beam received from the first half wave plate is linearly polarized.

According to a further embodiment, the first polarization beam splitter transmits the P polarization component and reflects the S polarization component.

According to a further embodiment, the first polarization beam splitter is inclined at an angle of from 45° to 60°.

According to a further embodiment, each of the half wave plates converts between the S polarization component and the P polarization component when inclined at an angle of 90°.

According to a further embodiment, the laser crystallizing apparatus includes a second laser generator that generates a second incident laser beam, a fourth half wave plate that shifts a polarization axis direction of the second incident laser beam received from the second laser generator to generate a seventh laser beam, a third mirror that reflects the seventh laser beam received from the fourth half wave plate, a second polarization beam splitter that reflects a part of the seventh laser beam reflected by the first mirror as an eighth laser beam and transmits the other part of the seventh laser beam as a ninth laser beam, a fourth mirror that reflects the ninth laser beam received from the second polarization beam splitter, a fifth half wave plate that shifts a polarization axis direction of the eighth laser beam received from the second polarization beam splitter to generate a tenth laser beam, and a sixth half wave plate that shifts the polarization axis direction of the ninth laser beam reflected by the fourth mirror to generate an eleventh laser beam.

According to a further embodiment, the second laser beam received from the fourth half wave plate is linearly polarized.

According to a further embodiment, the laser crystallizing apparatus includes a stage on which is mounted a target substrate with a target thin film, which is laser-crystallized by being irradiated by the emitted laser beam.

According to an embodiment, a randomly polarized laser beam can be converted into linearly polarized laser beam and can randomly adjust a polarization axis of a laser beam.

Further, a grain size and a grain alignment formed on a target thin film can be determined by adjusting an angle of the polarization axis in a line beam.

Further, because an optimal energy density (OPED) margin, which is the period range capable of using maximum energy, can be increased, users can use a predetermined polarization, and a number of shots may be decreased, which can increase the lifespan of the laser crystallizing apparatus.

Further, the same grain shape can be implemented using a few shots to reduce the shot number between processes.

DETAILED DESCRIPTION

Figure 1:
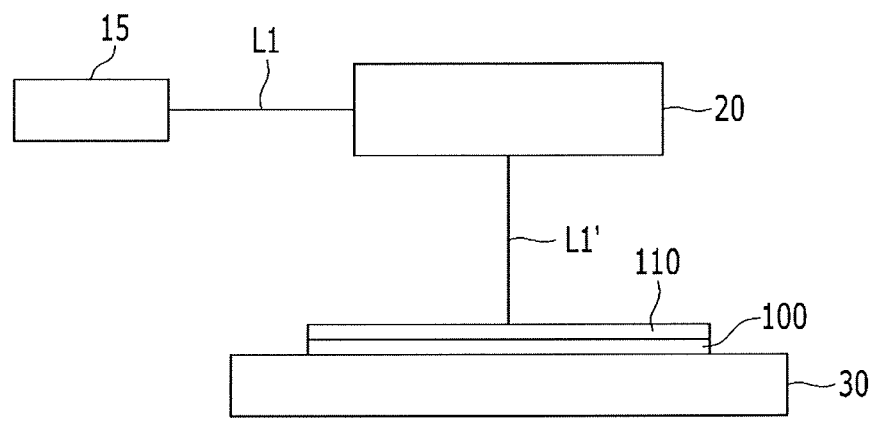
FIG. 1 schematically illustrates a laser crystallizing apparatus according to an exemplary embodiment.

As those skilled in the art would realize, the described embodiments may be modified in various different ways, all without departing from the spirit or scope of the present invention.

Further, in exemplary embodiments, like reference numerals may designate like elements having the same configuration, and after a first exemplary embodiment is described, differences of other exemplary embodiments with respect to a first exemplary embodiment will be described.

Relative dimensions and ratios of portions in the drawings may be exaggerated or reduced in size for clarity and convenience in the drawings, and any dimension are exemplary and non-limiting. In addition, like structures, elements, or components illustrated in two or more drawings may use like reference numerals for showing similar features. It will be understood that when an element such as a layer, film, region, or substrate is referred to as being "on" another element, it may be directly on the other element or intervening elements may also be present.

Hereinafter, a laser crystallizing apparatus according to an exemplary embodiment will be described with reference to FIGS. 1 and 2.

Figure 2:
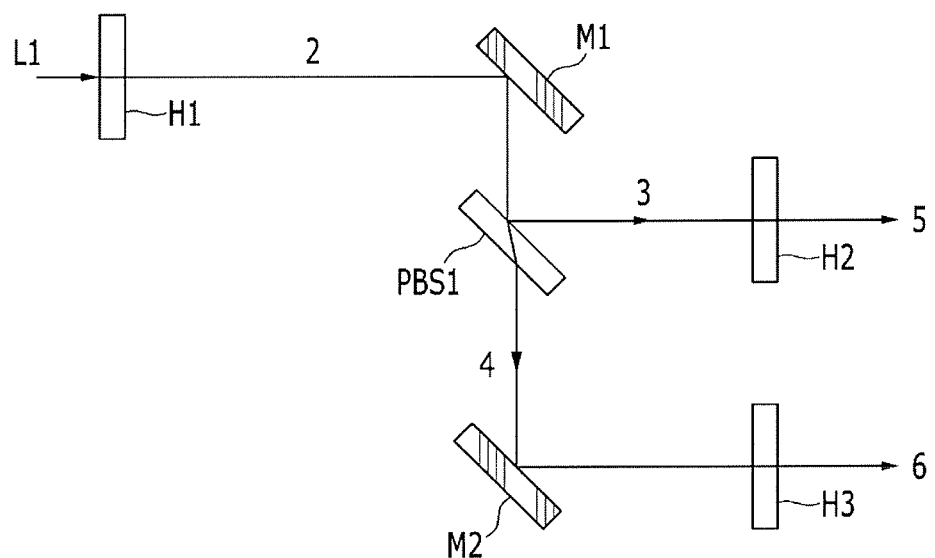
FIG. 2 schematically illustrates an optical system according to an exemplary embodiment.

FIG. 1 schematically illustrates a laser crystallizing apparatus according to an exemplary embodiment, and FIG. 2 schematically illustrates an optical system according to the exemplary embodiment.

Referring to FIG. 1, the laser crystallizing apparatus according to an exemplary embodiment includes a laser generator 15 that generates a first incident laser beam L1, an optical system 20 that converts the first incident laser beam L1 to generate an emitted laser beam L1', and a stage 30 on which is mounted a target substrate 100 with a target thin film 110, which is laser-crystallized by being irradiated with the emitted laser beam L1'. The first incident laser beam L1 generated by the laser generator 15 includes P polarization and S polarization and is converted into an emitted excimer laser beam L1' that induces a phase change in the target thin film 110 to crystallize the target thin film 110 on the target substrate 100. The target thin film 110 may be an amorphous silicon layer and may be formed by methods such as low pressure chemical deposition, normal pressure chemical deposition, plasma enhanced chemical vapor deposition (PECVD), sputtering, and vacuum evaporation.

The optical system 20 includes at least one half wave plate (HWP) that shifts a polarization axis direction of the first incident laser beam L1 received from the laser generator 15. In addition, the optical system 20 includes at least one mirror that fully reflects a laser beam. Further, the optical system 20 includes at least one polarization beam splitter (PBS) which reflects a part of a laser beam and transmits the other part of the laser beam.

Referring to FIG. 2, a laser crystallizing apparatus according to an exemplary embodiment includes a first laser generator that generates a first laser beam.

The optical system 20 according to an exemplary embodiment includes a first half wave plate H1, a first mirror M1, a first polarization beam splitter PBS1, a second mirror M2, a second half wave plate H2, and a third half wave plate H3. When the first incident laser beam L1 received from the first laser generator 15 passes through the first half wave plate H1, the polarization axis changes. The first incident laser beam L1 is initially randomly polarized and is converted into a second laser beam 2 that is linearly polarized by the first half wave plate H1. The polarization angle is adjusted into an optimal angle before that the second laser beam 2 is incident to the first polarization beam splitter PBS1. Further, the second laser beam 2 can be decomposed into a S polarization component in a plane of incidence, and a P polarization component perpendicular to the plane of incidence, and the S polarization and the P polarization of the second laser beam 2 are uniformly distributed.

The second laser beam 2 received from the first half wave plate H1 is reflected by the first mirror M1. The first mirror M1 reflects all of the second laser beam 2, including both the S polarization and P polarization components.

The second laser beam 2 reflected by the first mirror M1 propagates to the first polarization beam splitter PBS1, and the first polarization beam splitter PBS1 reflects part of the second laser beam 2 and transmits the other part of the second laser beam 2. According to an embodiment, the first polarization beam splitter PBS1 reflects the S polarization of the second laser beam 2 and transmits the P polarization. According to an embodiment, the first polarization beam splitter PBS1 reflects 50% of the second laser beam 2 and transmits 50% of the second laser beam 2.

A third laser beam 3 reflected by the first polarization beam splitter PBS1 propagates to a second half wave plate H2, which shifts a polarization axis direction of the third laser beam 3.

Further, a fourth laser beam 4 transmitted through the first polarization beam splitter PBS1 is reflected by the second mirror M2 to propagate to a third half wave plate H3, which shifts the polarization axis direction of the fourth laser beam 4.

The second half wave plate H2 and the third half wave plate H3 can be axially-rotated individually, and thus, the polarization axis angles can be independently adjusted. The second half wave plate H2 converts the S polarization third laser beam 3 into a P polarization fifth laser beam 5 by axial-rotation. The third half wave plate H3 converts the P polarization fourth laser beam 4 into an S polarization sixth laser beam 6 by axial-rotation. The fifth and sixth laser beams 5 and 6 that respectively propagate from the second half wave plate H2 and the third half wave plate H3 are combined to form the emitted laser beam L1', and the emitted laser beam L1' can be adjusted to have only the P polarization or have only the S polarization, based on the alignment of the grains to be formed in the target thin film 110. The laser crystallizing apparatus may convert random polarization laser beams L1 to linear polarization laser beams L1', and the emitted linear polarization laser beams L1' can be combined in a few shots, so that constructive interference occurs and periodicity is reinforced.

Figure 3:
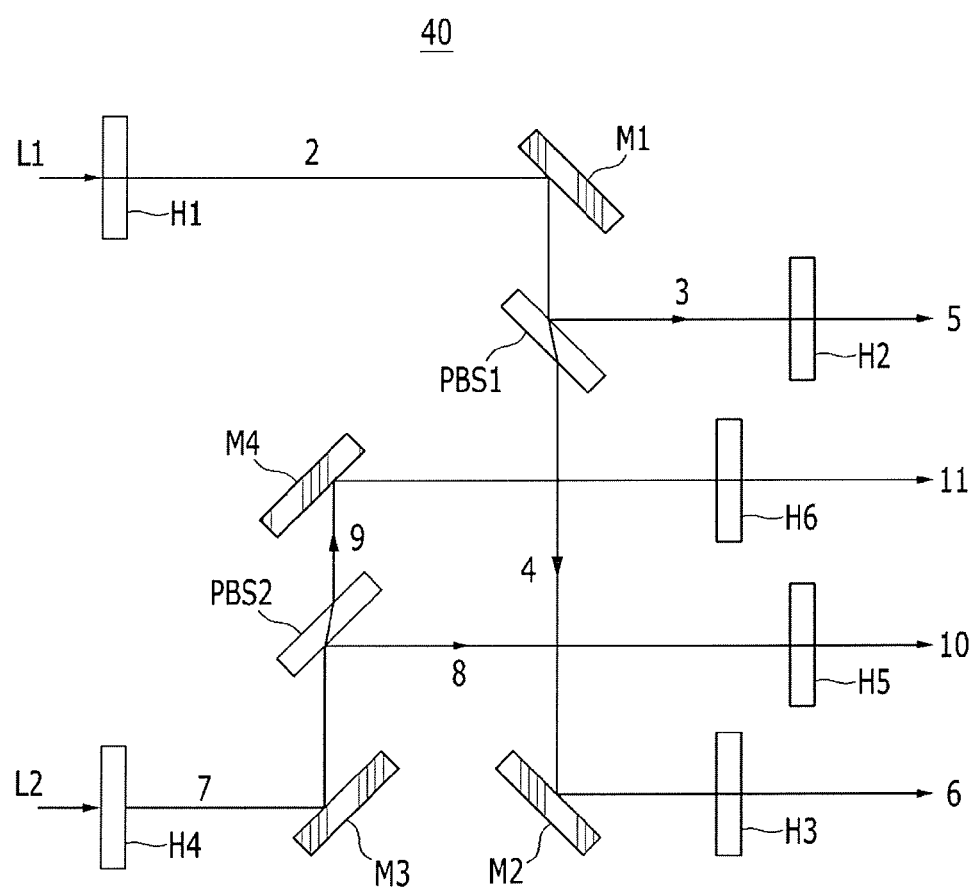
FIG. 3 schematically illustrates an optical system according to another exemplary embodiment.
Figure 4:
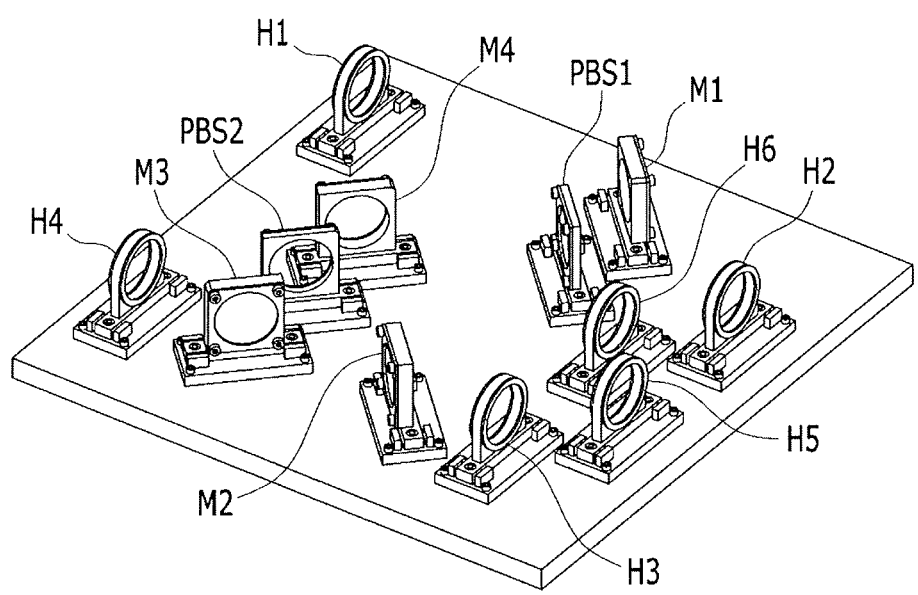
FIG. 4 is a perspective view that illustrates an optical system that includes a half wave plate, a mirror, and a polarization beam splitter according to another exemplary embodiment.

FIG. 3 schematically illustrates an optical system according to another exemplary embodiment, and FIG. 4 is a perspective view that schematically illustrates an optical system that includes a half wave plate, a mirror, and a polarization beam splitter according to another exemplary embodiment.

Referring to FIGS. 3 and 4, a laser crystallizing apparatus according to an exemplary embodiment further includes a second laser generator that generates a second incident laser beam L2 in addition to the laser crystallizing apparatus described in FIGS. 1 and 2, and an optical system 40 according to an exemplary embodiment further includes fourth to sixth half wave plates H4, H5, and H6, third and fourth mirrors M3 and M4, and a second polarization beam splitter PBS2, in addition to the components of the optical system described in FIGS. 1 and 2.

The second incident laser beam L2 received from the second laser generator includes P polarization and S polarization components and a polarization axis changes while passing through the fourth half wave plate H4. The second incident laser beam L2 is converted from a randomly polarized beam into a linearly polarized seventh laser beam 7 by the fourth half wave plate H4. Similarly to the role of the first half wave plate H1, the second half wave plate H2 adjusts the polarization angle to an optical angle in which the S polarization and the P polarization are uniformly distributed, and the second incident laser beam L2 propagates to the second polarization beam splitter PBS2.

The seventh laser beam 7 received from the fourth half wave plate H4 is fully reflected by the third mirror M3 and propagates to the second polarization beam splitter PBS2. The S polarization of the seventh laser beam 7 is reflected by the second polarization beam splitter PBS2 and the P polarization is transmitted by the second polarization beam splitter PBS2. According to an embodiment, the second polarization beam splitter PBS2 reflects 50% of the seventh laser beam 7 and transmits 50% thereof.

An eighth laser beam 8 reflected by the second polarization beam splitter PBS2 propagates to the fifth half wave plate H5, which shifts the polarization axis direction.

Further, a ninth laser beam 9 transmitted by the second polarization beam splitter PBS2 is reflected by the fourth mirror M4 to propagate to the sixth half wave plate H6, which shifts the polarization axis direction.

The fifth half wave plate H5 and the sixth half wave plate H6 can be axially-rotated individually, and thus, the polarization axis angle can be independently adjusted. The fifth half wave plate H5 converts the S polarized eighth laser beam 8 into a P polarization tenth laser beam 10 by axial-rotation. The sixth half wave plate H6 converts the P polarization ninth laser beam 9 of the into an S polarization eleventh laser beam 11 by axial-rotation. The fifth, sixth, tenth, and eleventh laser beams 5, 6, 10, and 11 respectively propagating from the second half wave plate H2, the third half wave plate H3, the fifth half wave plate H5, and the sixth half wave plate H6 are combined to form the emitted laser beam L1' and the emitted laser beam L1' can be adjusted to have only the P polarization or have only the S polarization, based on the alignment of the grains to be formed in the target thin film 110. The emitted laser beam L1' can reinforce periodicity and thus, the desired grains can be formed by only a few shots.

Figure 5:
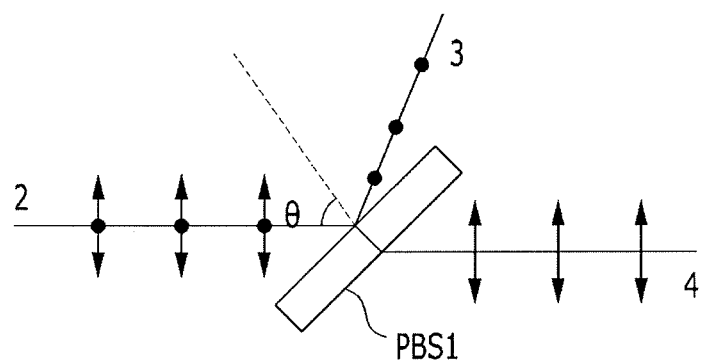
FIG. 5 illustrates a polarization beam splitter according to an exemplary embodiment.
Figure 6:
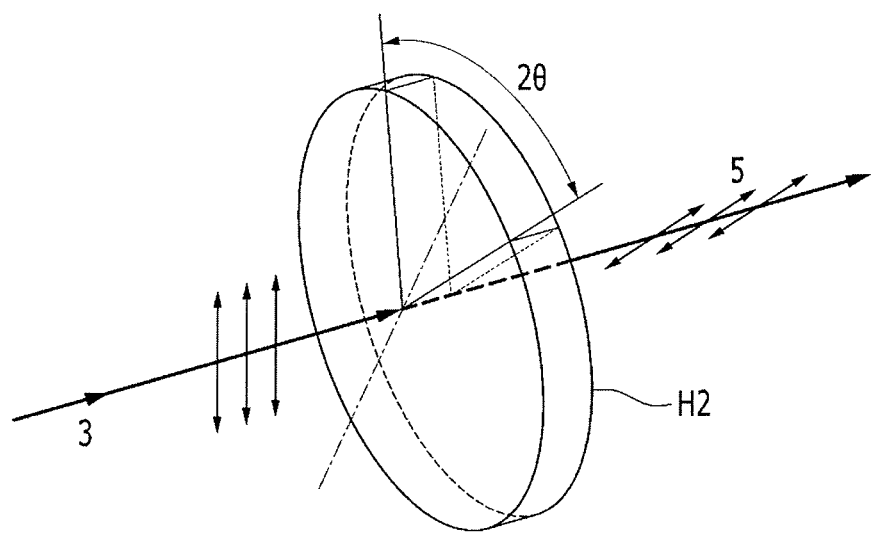
FIG. 6 schematically illustrates a half wave plate according to an exemplary embodiment.

FIG. 5 schematically illustrates a polarization beam splitter according to an exemplary embodiment, and FIG. 6 schematically illustrates a half wave plate according to an exemplary embodiment.

Referring to FIG. 5, the polarization beam splitter PBS1 inclined at an angle of between about 45° to about 60°. According to an embodiment, the polarization beam splitter PBS1 is inclined at an angle of 56°. According to an embodiment, the polarization beam splitter PBS1 is made of a dielectric material and can be made of fused silica. The second laser beam 2 incident to the polarization beam splitter PBS1 has an S polarization component incident at a predetermined angle θ with respect to a line perpendicular to the polarization beam splitter PBS1, which is reflected at the same angle as the third laser beam, and a P polarization component that is refracted by the polarization beam splitter PBS1 to propagate as the fourth laser beam 4 in the same direction as the incident second laser beam 2.

In addition, as illustrated in FIG. 6, the half wave plate H2 can rotate to change the polarization direction of the incident third laser beam 3 between the S polarization and the P polarization, based on the rotation angle θ. When the half wave plate H2 is inclined at an angle of 90° (θ=45°, the incident P component is converted into an S component, and the incident S component is converted into the P component. When the angle of the half wave plate H1 is set to an angle of 90°, the fifth laser beam 5, which includes the P wave of 50% and the S wave of 50%, respectively, is formed.

When the S polarization and the P polarization of the second laser beam 2 emitted from the polarization beam splitter PBS1 pass through independently rotatable half wave plates, the polarization axis of the laser beam can be shifted into an optimal polarization axis for grain alignment. A beam energy can be maximized by individually adjusting the half wave plates.

As such, according to exemplary embodiments, a randomly polarized laser beam can be converted into a linearly polarized laser beam and a polarization axis of a laser beam can be randomly adjusted.

Further, the grain size and grain alignment formed on a target thin film can be determined by adjusting an angle of the polarization axis in a line beam.

Further, an optimal energy density (OPED) margin, which is a period range capable of using maximum energy, can be increased because the grains can be aligned in a predetermined state by the polarization, which can increase the lifespan of the laser crystallizing apparatus.

Further, the same grain shape can be implemented by fewer shots to reduce the number of shots between processes.

While this disclosure has been described in connection with what is presently considered to be practical exemplary embodiments, it is to be understood that the embodiments of the disclosure are not limited to the disclosed exemplary embodiments, but, on the contrary, are intended to cover various modifications and equivalent arrangements included within the spirit and scope of the appended claims.

What is claimed is:

1. A laser crystallizing apparatus, comprising:
a laser generator that generates an incident laser beam that includes a P polarization component and an S polarization component;
an optical system that converts the incident laser beam to generate an emitted laser beam; and
a stage on which is mounted a target substrate with a target thin film, which is laser-crystallized by being irradiated by the emitted laser beam,
wherein the optical system includes
a half wave plate (MVP) that shifts a polarization axis direction of the incident laser beam,
a mirror that fully reflects the laser beam, and
a polarization beam splitter (PBS) which partially reflects and partially transmits the laser beam,
wherein the mirror is disposed in the optical path of the incident laser beam between the HWP and the plurality of PBS.

2. The laser crystallizing apparatus of claim 1, wherein the laser generator includes a first laser generator that generates a first incident laser beam, and
the optic system includes
a first half wave plate that shifts a polarization axis direction of the first incident laser beam received from the first laser generator to generate a second laser beam;
a first mirror that reflects the second laser beam received from the first half wave plate,
a first polarization beam splitter that reflects a part of the second laser beam received from the first mirror as a third laser beam and transmits the other part of the second laser beam as a fourth laser beam,
a second mirror that reflects the forth laser beam received from the first polarization beam splitter,
a second half wave plate that shifts a polarization axis direction of the third laser beam received from the first polarization beam splitter to generate a fifth laser beam, and
a third half wave plate that shifts the polarization axis direction of the fourth laser beam received from the second mirror to generate a sixth laser beam.

3. The laser crystallizing apparatus of claim 2, wherein the first incident laser beam is randomly polarized.

4. The laser crystallizing apparatus of claim 2, wherein: the second laser beam received from the first half wave plate is linearly polarized.

5. The laser crystallizing apparatus of claim 1, wherein: the polarization beam splitter transmits the P polarization component and reflects the S polarization component.

6. The laser crystallizing apparatus of claim 1, wherein: the polarization beam splitter is inclined at an angle of from 45° to 60°.

7. The laser crystallizing apparatus of claim 1, wherein: the polarization beam splitter is made of fused silica.

8. The laser crystallizing apparatus of claim 1, wherein: the half wave plate converts between the S polarization component and the P polarization component when inclined at an angle of 90°.

9. The laser crystallizing apparatus of claim 2, wherein: the laser generator further includes a second laser generator that generates a second incident laser beam, and
the optical system further includes
a fourth half wave plate that shifts a polarization axis direction of the second incident laser beam received from the second laser generator to generate a seventh laser beam,
a third mirror that reflects the seventh laser beam received from the fourth half wave plate,
a second polarization beam splitter that reflects a part of the seventh laser beam reflected by the first mirror as an eighth laser beam and transmits the other part of the seventh laser beam as a ninth laser beam,
a fourth mirror that reflects the ninth laser beam received from the second polarization beam splitter,
a fifth half wave plate that shifts a polarization axis direction of the eighth laser beam received from the second polarization beam splitter to generate a tenth laser beam, and
a sixth half wave plate that shifts the polarization axis direction of the ninth laser beam reflected by the fourth mirror to generate an eleventh laser beam.

10. The laser crystallizing apparatus of claim 9, wherein: the second laser beam received from the fourth half wave plate is linearly polarized.

11. A laser crystallizing apparatus, comprising
a first laser generator that generates a first incident laser beam that includes a P polarization component and an S polarization component;
a first half wave plate that shifts a polarization axis direction of the first incident laser beam received from the first laser generator to generate a second laser beam;
a first mirror that fully reflects the second laser beam received from the first half wave plate;
a first polarization beam splitter that reflects a part of the second laser beam received from the first mirror as a third laser beam and transmits the other part of the second laser beam as a fourth laser beam;
a second mirror that fully reflects the fourth laser beam received from the first polarization beam splitter;
a second half wave plate that shifts a polarization axis direction of the third laser beam received from the first polarization beam splitter to generate a fifth laser beam; and
a third half wave plate that shifts the polarization axis direction of the fourth laser beam received from the second mirror to generate a sixth laser beam,
wherein the fifth laser beam and the sixth laser beam are combined to the emitted laser beam.

12. The laser crystallizing apparatus of claim 11, wherein: the first incident laser beam is randomly polarized.

13. The laser crystallizing apparatus of claim 12, wherein: the second laser beam received from the first half wave plate is linearly polarized.

14. The laser crystallizing apparatus of claim 13, wherein: the first polarization beam splitter transmits the P polarization component and reflects the S polarization component.

15. The laser crystallizing apparatus of claim 11, wherein: the first polarization beam splitter is inclined at an angle of from 45° to 60°.

16. The laser crystallizing apparatus of claim 11, wherein: the first polarization beam splitter is made of fused silica.

17. The laser crystallizing apparatus of claim 11, wherein: each of the half wave plates converts between the S polarization component and the P polarization component when inclined at an. angle of 90°.

18. The laser crystallizing apparatus of claim 11, further comprising:
a second laser generator that generates a second incident laser beam that includes a P polarization component and an S polarization component;
a fourth half wave plate that shifts a polarization axis direction of the second incident laser beam received from the second laser generator to generate a seventh laser beam;
a third mirror that reflects the seventh laser beam received from the fourth half wave plate;
a second polarization beam splitter that reflects a part of the seventh laser beam reflected by the first mirror as an eighth laser beam and transmits the other part of the seventh laser beam as a ninth laser beam;
a fourth mirror that reflects the ninth laser beam received from the second polarization beam splitter;
a fifth half wave plate that shifts a polarization axis direction of the eighth laser beam received from the second polarization beam splitter to generate a tenth laser beam; and
a sixth half wave plate that shifts the polarization axis direction of the ninth laser beam reflected by the fourth mirror to generate an eleventh laser beam.

19. The laser crystallizing apparatus of claim 18, wherein: the second laser beam received from the fourth half wave plate is linearly polarized.

20. The laser crystallizing apparatus of claim 11, further comprising a stage on which is mounted a target substrate with a target thin film, which is laser-crystallized by being irradiated by the emitted laser beam.

* * * * *